(12) United States Patent
Tsutsui

(10) Patent No.: US 6,352,928 B2
(45) Date of Patent: *Mar. 5, 2002

(54) METHOD OF FORMING TRENCH ISOLATION

(75) Inventor: Kenji Tsutsui, Fukuyama (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,215

(22) Filed: Mar. 30, 2000

(30) Foreign Application Priority Data

Jun. 2, 1999 (JP) ............................................ 11-154767

(51) Int. Cl.$^7$ .................. H01L 21/302; H01L 21/3065; H01L 21/311; H01L 21/461
(52) U.S. Cl. ...................... 438/692; 438/700; 438/706; 438/745
(58) Field of Search ................................ 438/692, 745, 438/700, 706

(56) References Cited

U.S. PATENT DOCUMENTS

| 4,853,343 A | * | 8/1989 | Uchida et al. ............... 438/361 |
| 4,914,050 A | * | 4/1990 | Shibata ........................ 438/301 |
| 5,498,565 A | * | 3/1996 | Gocho et al. ................ 438/427 |
| 5,976,949 A | * | 11/1999 | Chen ........................... 438/427 |
| 5,728,621 A | * | 5/2000 | Zheng et al. ................ 438/427 |
| 6,057,210 A | * | 5/2000 | Yang et al. .................. 438/427 |

FOREIGN PATENT DOCUMENTS

JP          5-275527          10/1993

* cited by examiner

Primary Examiner—Benjamin L. Utech
Assistant Examiner—Lynette T. Umez-Eronini
(74) Attorney, Agent, or Firm—Nixon & Vanderhye P.C.

(57) ABSTRACT

A method of forming trench isolation comprising the steps of: burying a plurality of trenches formed in a substrate with a burying material and simultaneously forming a burying material layer on protrusive regions between adjacent trenches, by use of a process for concurrently executing vapor phase growth and etching; conducting an isotropic etching in such a manner as to leave the burying material layer on the protrusive region; and removing the remaining burying material layer by a CMP process for planarization.

8 Claims, 6 Drawing Sheets

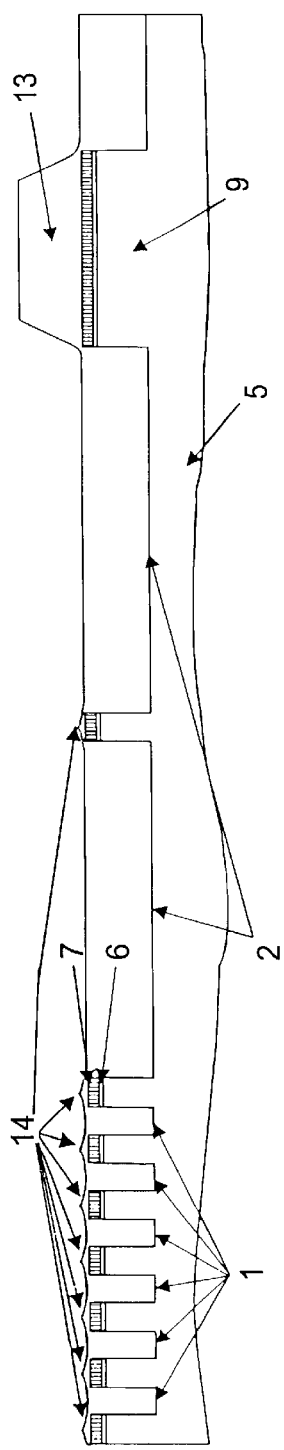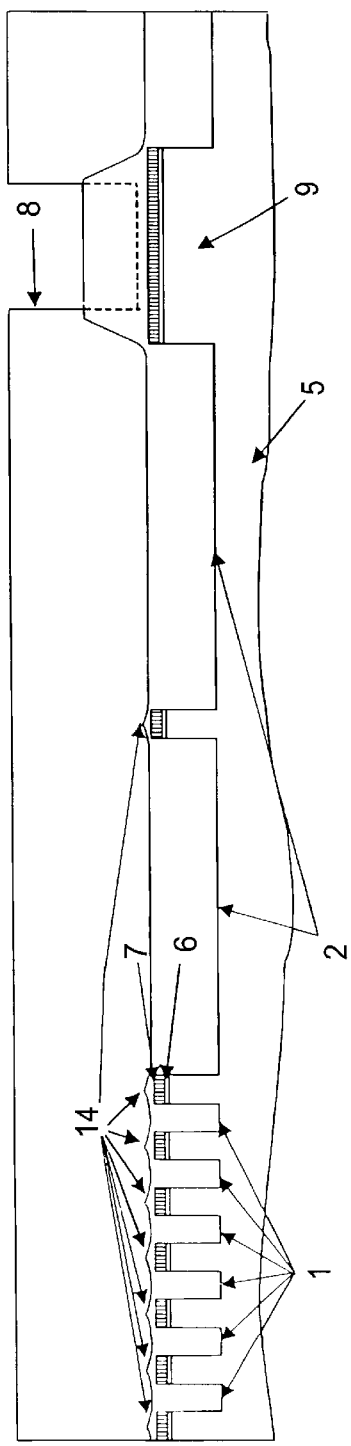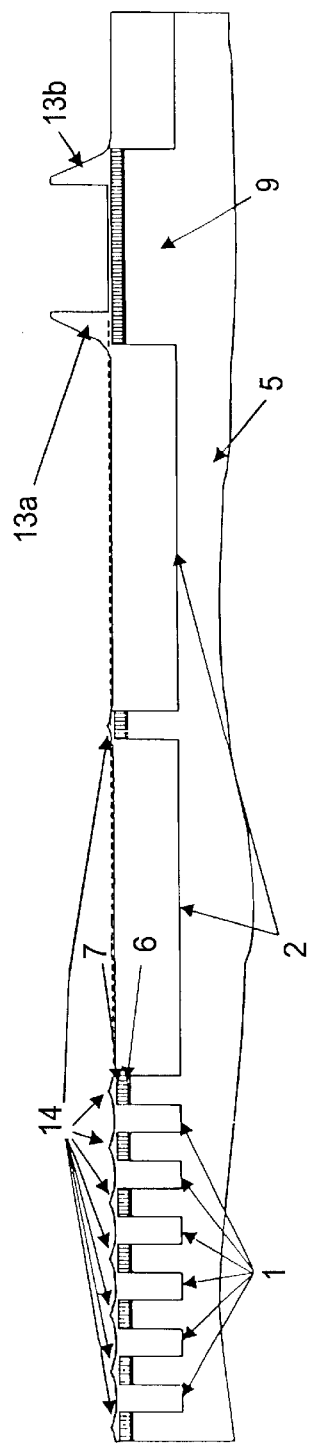

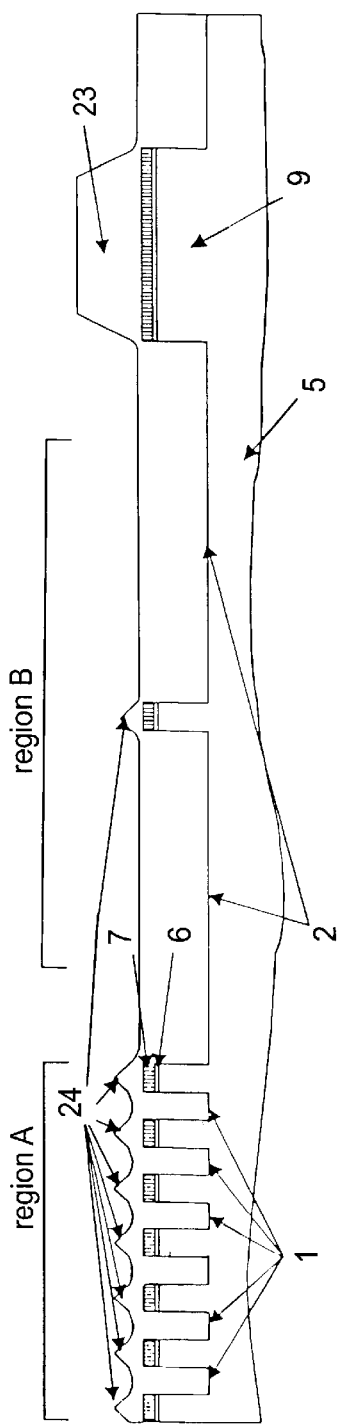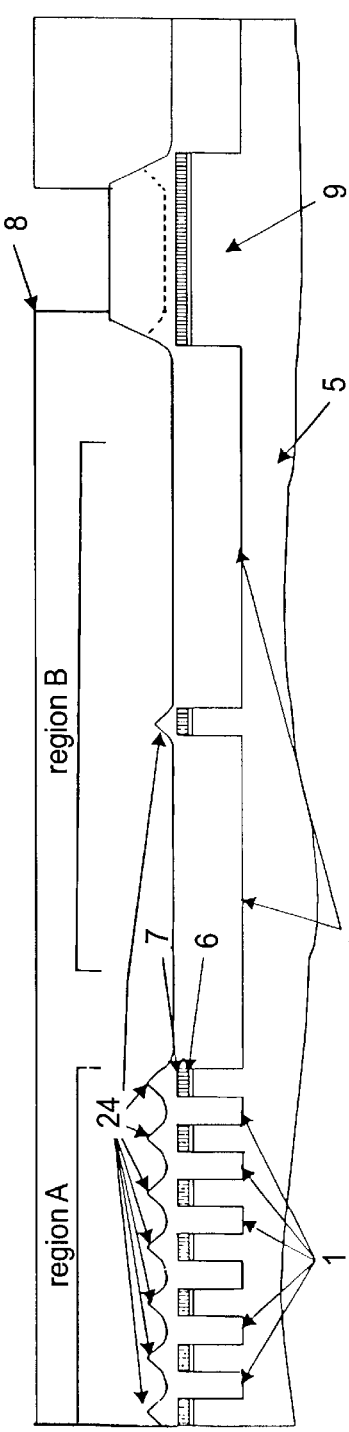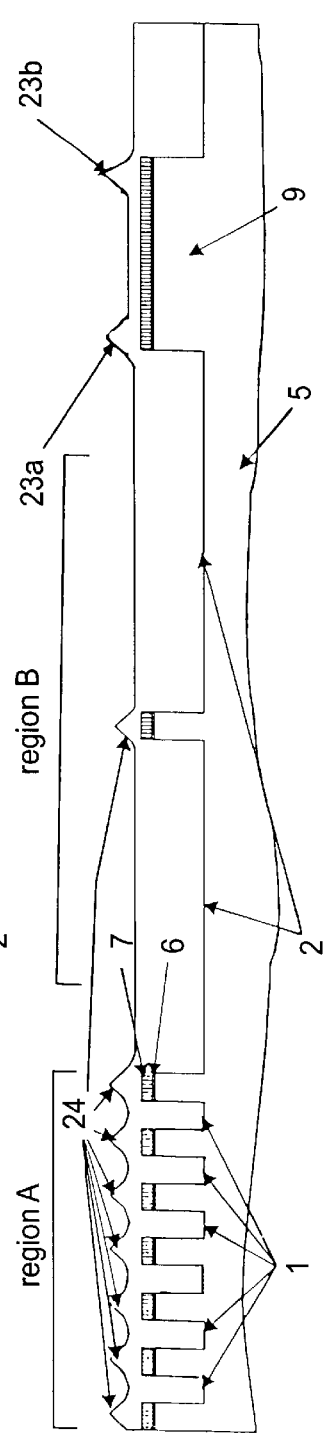
Fig.5(a) (PRIOR ART)
Fig.5(b) (PRIOR ART)
Fig.5(c) (PRIOR ART)

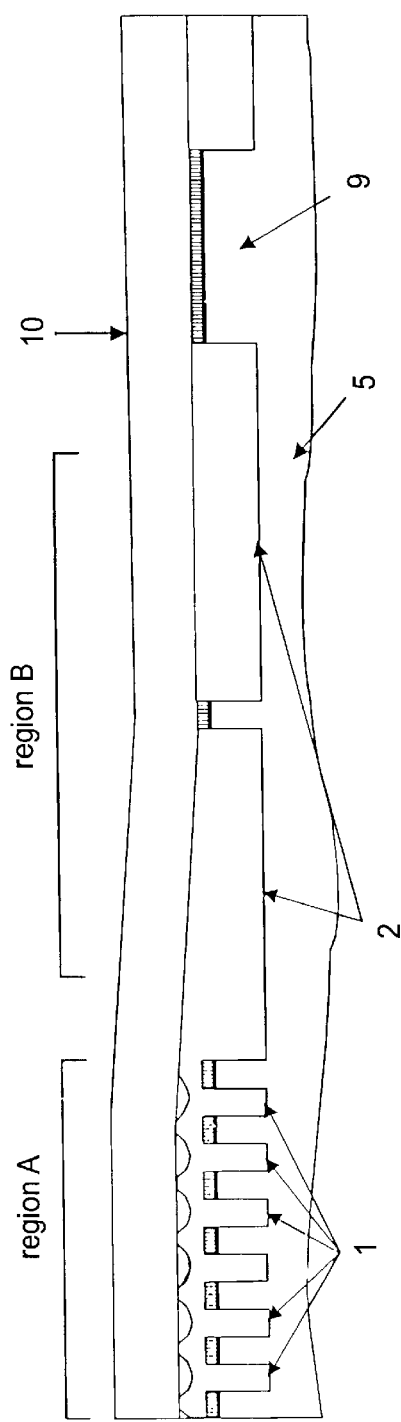
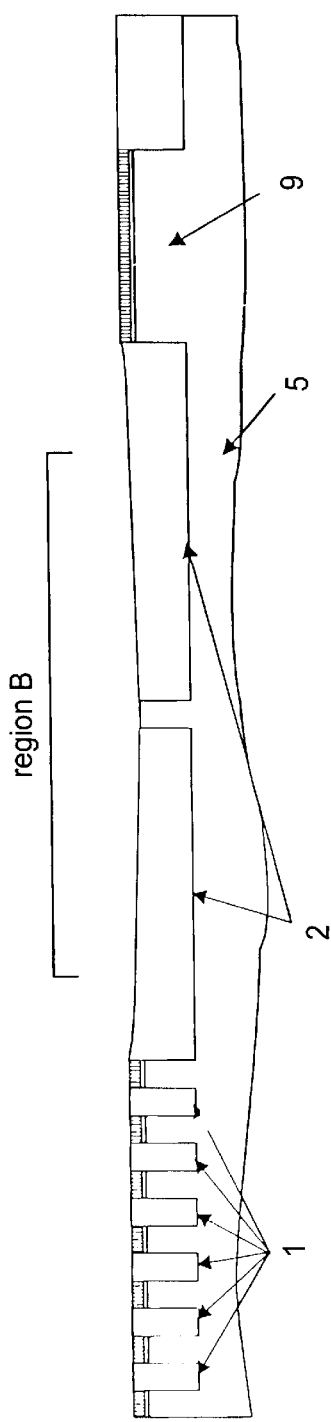

METHOD OF FORMING TRENCH ISOLATION

CROSS-REFERENCE TO RELATED APPLICATION

This application is related to Japanese application No. HEI 11(1999)-154767 filed on Jun. 2, 1999, whose priority is claimed under 35 USC § 119, the disclosure of which is incorporated by reference in its entirety.

BACKGROUND OF THE INVENTION

1. Field of the Invention

This invention relates to a method of forming trench isolation and a method of producing a semiconductor device. The present invention can be utilized for producing various semiconductor devices containing a concave portion burying process step and a subsequent planarization CMP process step, particularly for producing those semiconductor devices which have trench isolation (trench type device isolation).

The present invention can be utilized also for producing semiconductor devices that call for a burying process step, that buries concave portions defined by a plurality of convex regions (i.e. defined between convex regions), by a burying material, and a CMP process step for planarizing the burying material layer formed on each convex region.

2. Description of Related Art

The size of integrated circuits has become smaller and smaller. Therefore, it has become all the more necessary to arrange those components which constitute an integrated circuit adjacent to one another in a limited space. Studies in general have been directed to improve the density of an active region per unit area of a semiconductor substrate. For this reason, effective isolation between circuits has become more important.

The shape of a shallow trench, which is formed by etching a semiconductor substrate to form a trench and charging the trench by an insulating material, such as silicon dioxide, has been employed in existing integrated circuit technologies. The region in which this isolation is defined is generally referred to as "shallow trench isolation (STI)". If this STI region is utilized, the active region of an integrated circuit can be formed substantially in an arbitrary size. Therefore, the size of the STI region varies over a broad range.

Particularly when a shallow trench the width of which varies over a broad range is used for complicated topography of existing integrated circuits, the problem of non-uniform burying of an oxide often arises when the oxide is uniformly charged into the trench. To cope with this problem, a method that charges an insulation material into the STI region, and a large number of planarization methods that planarize the resulting structure to uniform topography, have been developed.

The following methods are known for forming flat trench isolation, for example.

First, a thin silicon dioxide film and a thin silicon nitride film are formed on a silicon substrate. Trenches are then formed in the silicon substrate by etching through a photolithography step. Silicon dioxide is deposited as a burying material. When this deposited silicon dioxide is polished, flat trench isolation can be formed because the silicon nitride film having a lower polishing rate than silicon dioxide functions as a stopper layer.

If convex regions having a small width exist in a coarse and fine distribution, the coarse regions turn to a convex shape and cannot be planarized. This problem can be solved if a dummy pattern having the same convex shape is inserted. When the dummy pattern is inserted, this portion becomes an active region. It increases a capacity and eventually results in the problem that a device speed gets slow. Therefore, the dummy pattern cannot be inserted from time to time.

If any convex regions having a wide top surface exist, silicon dioxide as the burying material remains at the center of the wide top surface of the convex regions and result in the formation of particles. These problems are known in the art, and are explained in Japanese Unexamined Patent Publication No. HEI 5(1994)-275527.

Therefore, Japanese Unexamined Patent Publication No. HEI 5(1994)-275527 employs deposition means called "bias ECR-CVD process" that executes concurrently etching and deposition, as a deposition method of the burying material.

This deposition method can deposit the burying material layer 23 made of silicon dioxide and having a trapezoidal section that is thicker than on the top surfaces of the narrow convex regions (A and B), on the top surface of the wide convex region 9 as shown in FIG. 5(a). On the other hand, this method can deposit the burying material layer 24 having a triangular section on the top surface of the convex regions having a small width.

According to this Publication, the burying material layer on the wide convex region is isotropically etched using a resist mask after the deposition by the bias ECR-CVD process. As a result of this etching, the shape of the burying material layer on the wide convex region is made similar to the triangular shape on the convex regions having a small width. Only the triangular portion is polished and is then etched back for planarization (see Example 1 and FIG. 1 of Japanese Unexamined Patent Publication No. HEI 5(1994)-275527).

This Publication describes also the following method in which the etch-back step of the method described above is omitted. First, silicon dioxide is buried into the same depth as the trench depth at the time of deposition by the bias ECR-CVD process. Next, the burying material layer made of silicon dioxide on the wide convex region is isotropically etched so that the shape of the burying material layer on the wide convex region is changed to the shape similar to the triangular shape on the convex regions having a small width. Thereafter, the triangular burying material layer is polished and planarized (see Example 2 and FIG. 3 of Japanese Unexamined Patent Publication No. HEI 5(1994)-275527).

Such means is applied to the formation of a flat inter-layer insulation film such as the formation of a trench capacitor involving burying of a groove, the formation of a trench contact (trench plug), the formation of a blanket W-CVD process, and so forth, besides the formation of trench isolation.

However, all the technologies described above are not yet free from the problem that the degree of polishing relies on an underlying pattern and planarization cannot be done sufficiently. This problem will be explained with reference to FIGS. 5(a) to 5(c) and FIGS. 6(d) and 6(e).

Three regions, that is, a wide convex region 9, a region A having narrow convex patterns in a high density and a region B having narrow convex patterns in a low density, exist generally on a substrate 5 as shown in FIG. 5(a). A lower layer 6 comprising a thin silicon oxide film as a polishing stopper layer and an upper layer 7 comprising a thin silicon nitride film exist on the upper surface of each convex portion. Burying material layers 23 and 24 are deposited to such a substrate 5 by deposition means that concurrently executes etching and deposition.

Next, a resist mask 8 having an opening at the portion thereof corresponding to the wide convex region 9 is formed, as shown in FIG. 5(*b*).

The burying material layer 23 is isotropically etched at the end portion of the resist mask 8 until it reaches substantially the same size as that of the triangular shape of other regions. This etching provides triangular burying material layers 23*a* and 23*b*. Thereafter, the resist mask 8 is removed (see FIG. 5(*c*)).

Polishing is then effected using a pad 10. In this instance, polishing of the triangular convex portions can be made within a short time, and uniformity on a inner-surface of the wafer surface can be secured to a certain extent. However, the load varies depending on the number of convex portions because the density of the convex portions is different. In consequence, the polishing rate is low in the region A but is high in the region B and the wide convex region 9 as shown in FIG. 6(*d*).

When the region A is polished, the wide convex region 9 is not recessed because the area of the polishing stopper layer is great, as shown in FIG. 6(*e*). However, the region B is recessed with the result that polishing cannot be done uniformly.

Such a problem is likely to develop in the memory portion having a greater number of convex portions and in the peripheral circuit portion having a smaller number of convex portions.

The explanation given above deals with the three regions, that is, the wide convex region 9, the region A having the convex patterns of a small width in a high density and the region B having the convex patterns of a small width in a low density. However, it also holds true of the case where only the regions A and B exist but the wide convex region 9 does not exist.

The height of the burying material layer that is deposited is different between the region A having the convex patterns of a small width in a high density and the region B having the convex patterns of a small width in a low density. Speaking more concretely, the deposition height is greater in the dense region A. This difference of height is one of the factors that invites variance at the time of polishing. Incidentally, in the case of the technology of the Publication cited above, the burying material is deposited most thickly to the wide convex region 9, but the problem does not occur because this region is etched to a smaller thickness.

SUMMARY OF THE INVENTION

In view of the problems with the prior art described above, the present invention aims at providing means for accomplishing planarization of regions, where a plurality number of narrow convex regions exist, without leaving a burying material layer on the top surface of the convex regions, and the means thus capable of forming trench isolation having high planarity. The present invention aims also at providing fabrication means of semiconductor devices by utilizing the means described above.

When the distribution of the polishing stopper layer is not uniform as in the prior art (for example, when the density of the convex regions is not uniform, hence the occupying ratio of the polishing layer is not uniform) a technology that can attain excellent planarization in the portions having a low area ratio, that is, the peripheral circuit portions playing the role of the polishing stopper, having a low density, has been desired.

In a production method of a semiconductor device which method includes a polishing step of carrying out planarization after a burying step, it is therefore an object of the present invention to provide a production method of a semiconductor device which method can accomplish an excellent planar shape even when the distribution of portions, that exhibit a polishing stopper, is not uniform on a to-be-polished portion and even at portions where an area ratio of the polishing stopper layer per unit area is low.

According to the present invention, there is provided a method of forming trench isolation comprising the steps of:

burying a plurality of trenches formed in a substrate with a burying material and simultaneously forming a burying material layer on protrusive region between adjacent trenches, by use of a process for concurrently executing vapor phase growth and etching;

conducting an isotropic etching in such a manner as to leave the burying material layer on the protrusive region; and removing the remaining layers of the burying material by a CMP process for planarization.

Further, according to the present invention, there is provided a method of forming trench isolation comprising the steps of:

burying a plurality of trenches formed in a substrate with a burying material and simultaneously forming a burying material layer on protrusive region between adjacent trenches, by use of a process for concurrently executing vapor phase growth and etching; and removing the remaining the burying material layer by a CMP process for planarization, wherein the burying material layer on the protrusive region between adjacent trenches is a triangular layer whose maximum height is not greater than 0.06 $\mu$m.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3(*a*) to 3(*c*) are schematic views illustrating the formation of trench isolation in accordance with Example 2 of the present invention;

FIGS. 5(*a*) to 5(*c*) are schematic views illustrating drawbacks of a conventional trench isolation; and FIGS. 6(*d*) and 6(*e*) are schematic views illustrating drawbacks of the conventional trench isolation.

DESCRIPTION OF THE PREFERRED EMBODIMENTS

Figure 1A:
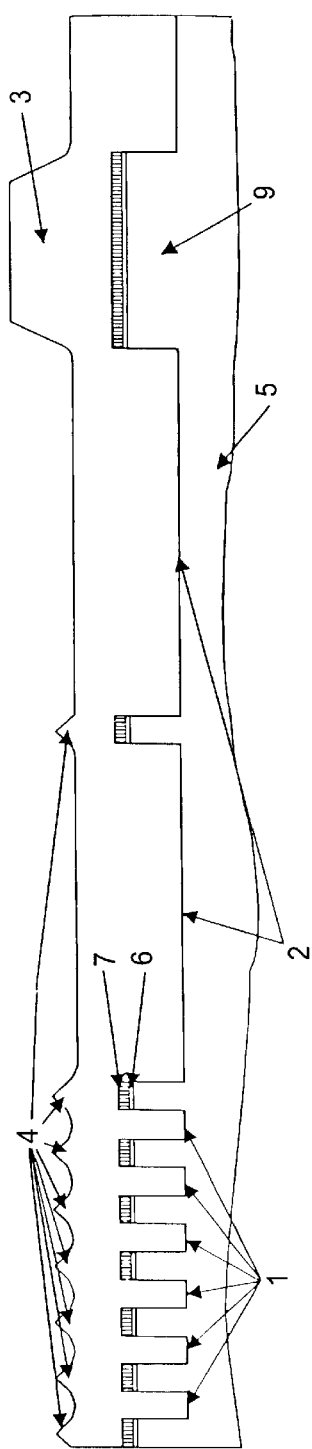
FIGS. 1(*a*) to 1 (*c*) are schematic views illustrating the formation of trench isolation in accordance with Example 1 of the present invention.

Hereinafter, the present invention will be explained in further detail.

To begin with, a trench buried by a burying material in the present invention may be directly formed on the substrate, or may be formed in a semiconductor film laminated on a substrate. In this instance, the substrate is not limited, in particular, and known substrates can be employed. Examples of the substrate include a semiconductor substrate such as a silicon substrate, a glass substrate and a resin substrate. An example of the semiconductor film is a silicon film.

This substrate is preferably covered with a layer (a polishing stopping layer) resistant to etching and a CMP process that are to be later applied. Examples of such a layer include a silicon nitride film and a poly-silicon film. The polishing stopper layer may comprise a laminate body of a silicon dioxide film and a silicon nitride film formed on the silicon dioxide film.

The trench can be formed by known methods such as a method that combines a photolithography step with an etching step, a laser depiction method, and so forth. The present invention can be employed advantageously when a plurality of trenches are formed and the gaps among these trenches are different. The shape of the trench can be set to a desired shape. When the polishing stopper layer is formed through the formation of this trench, the layer exists on only the top surface of the convex portion.

The formation method of the present invention is particularly useful when a plurality of trenches including region having a small trench width and region having a large trench width are buried. A plurality of trenches may exist in each of these regions.

When a plurality of trenches exist, the width of the convex portion existing between the trenches is preferably substantially equal in both regions. Convex portion having a greater width than the convex portion (hereinafter called the "convex portion having a small width") may exist partially.

Next, the trench is buried by the burying material by means of the method that executes concurrently vapor phase growth and etching.

Examples of the method that executes concurrently vapor phase growth and etching includes a high density plasma enhanced chemical vapor phase growth (HDP) process, and a bias ECR-CVD process. According to these processes, a burying material layer having a triangular sectional shape (hereinafter called the "triangular layer") is formed on the top surface of the convex portion having a small width. Incidentally, when the vapor phase growth process is alone used, the side wall of the resulting burying material layer becomes arcuate in the sectional shape.

Low frequency power (LF), high frequency power (HF) and pressure are selected appropriately as the operation condition of the HDP method, that is one of the methods that execute concurrently vapor phase growth and etching, so that the shape of the burying material layer on the top surface of the convex portions having a small width becomes triangular, though the condition varies depending on the width of the convex portion.

Microwave power, RF power, a magnetic field and a pressure are selected appropriately as the operation condition of the bias ECR-CVD process so that the shape of the burying material layer on the top surface of the convex portions having a small width becomes triangular, though the condition varies depending on the width of the convex portion in the same way as in the HDP method described above.

An example of the burying material is silicon dioxide.

The burying material layer is etched isotropically. This etching is generally conducted for the entire surface of the layer, and can make the triangular layer on the top surface of the convex portion small. It is not preferable to remove completely this layer because the burying material inside the trench may be over-etched. Therefore, the triangular layer is etched preferably in such a fashion that its maximum height is not greater than 0.06 $\mu$m. Incidentally, the term "maximum height" means the height from the bottom to the top of the triangular layer.

Next, planarization can be accomplished as the burying material layer remaining on the upper surface of the convex portion is removed by the CMP process. Planarization by the CMP process can be carried out under the known condition without specific limitation.

If the wide convex portion remain and moreover if the burying material is deposited in this case under a condition such that the burying material layer having the triangular sectional shape is formed on the top surface of the convex portion having a small width, a trapezoidal layer is formed on the burying material layer. This trapezoidal layer may remain as such even after isotropic etching and CMP process are carried out. It is therefore preferable to etch the center portion of the trapezoidal layer to a predetermined depth before isotropic etching is carried out. This etching allows the burying material to remain only in the peripheral portion. Since the remaining layer has a small amount of protrusions, it has a higher polish rate than a planar surface and can be easily planarized. In consequence, planar isolation can be formed.

This etching can be conducted by an isotropic wet etching method using 10:1 BHF or anisotropic dry etching method by magnetron RIE.

The "predetermined depth" described above is preferably such that the height of the center portion is substantially equal to the height of the lower portion of the triangular layer on the convex portion having a small width.

According to the method described above, the major proportions of the burying material layer, that is to be removed by the CMP process, on the wide convex region and the triangular layer on the active region having a small width are removed in advance. Therefore, the difference of the load of the CMP process resulting from the number of triangular shapes can be eliminated, and planar isolation can be formed easily even when the area ratio of the polishing stopper layer is low.

When the maximum height of the triangular layer is not greater than 0.06 $\mu$m, planar trench isolation can be formed by the following method, too. First, the maximum height of the triangular layer can be limited to not greater than 0.06 $\mu$m by conducting the method, that concurrently executes vapor phase growth and etching, under the condition where etching proceeds preferentially. Since the maximum height of the triangular layer is sufficiently small by this method, planar trench isolation can be formed by conducting the CMP process without conducting isotropic etching.

This method can be suitably used for the production method of the semiconductor device having trench isolation.

EXAMPLE

Hereinafter, Examples of the present invention will be explained with reference to the drawings. Quite naturally, however, the present invention is in no way limited to these Examples.

Example 1

In this example, the present invention was applied to the fabrication of a miniaturized and integrated semiconductor device, particularly to the formation of its trench isolation.

First, a lower layer 6 as a thermal oxidation film (T-SiO$_2$) and an upper layer 7 as a silicon nitride film were formed in advance on a substrate 5 made of silicon. Next, the substrate 5 was etched to form trenches 1 having a small width, trenches 2 having a large width, convex regions having a small width and convex regions 9 having a large width.

After the trenches were formed, the substrate was subjected to the following process steps (1) to (7) to form trench isolation. (1) An SiO$_2$ film was formed to a depth greater than the trench depth by a high-density plasma enhanced chemical vapor growth process (HDP) as one of the deposition means for executing concurrently vapor phase growth and etching. There were thus formed burying material layers 3 (trapezoidal layer) and 4 (triangular layer, maximum height of 0.22 μm). The structure shown in FIG. 1(*a*) was thus obtained. The deposition condition at this time was LF=4,000 W, HF=2,000 W, SiH$_4$/O$_2$/He=300/154/325 sccm, pressure=2 mTorr and E/D ratio=0.14.

Since the wide convex region 9 existed on the substrate 5, the substrate 5 was subjected to the following steps (2) and (3).

Figure 1B:
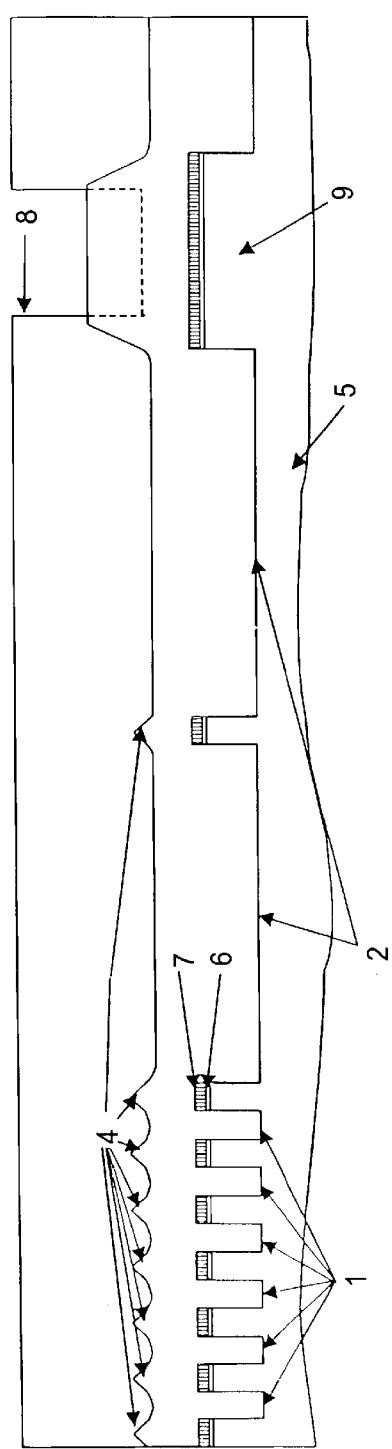
Figure 1C:
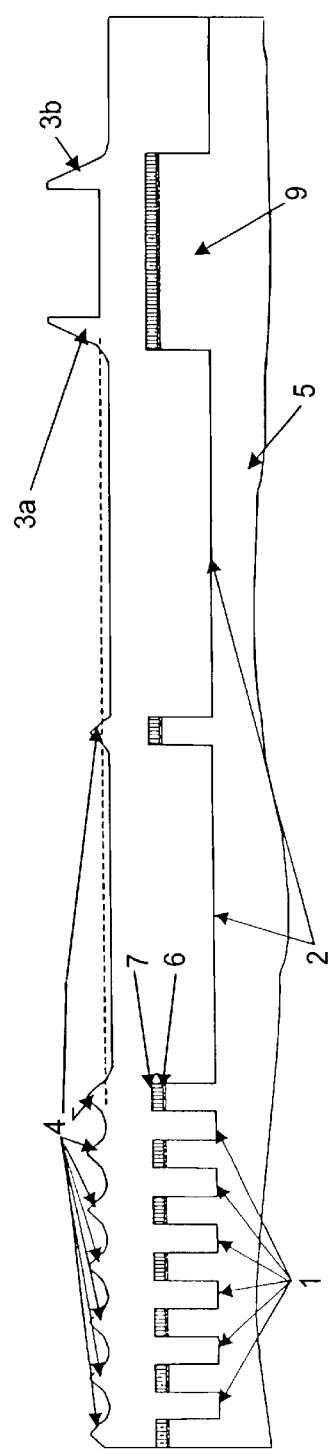

(2) As shown in FIG. 1 (*b*), a resist was patterned in such a manner as to remain on regions other than the wide convex region 9 (on the trapezoidal layer) to form a resist mask 8.

(3) The burying material 3 was then etched. The etching operation was conducted using magnetron RIE (anisotropic dry etching) under the condition of CH$_4$/CHF$_3$/Ar=50/30/400 sccm, RF power=1,300 W and pressure=250 mTorr.

At this time, etching was carried out onto the active region having a small width, that is, to the height of the flat portion on the trench 1 (the height indicated by dotted line). As a result of this etching, burying material layers 3*a* and 3*b* were formed on the wide convex region 9. The resist mask 8 was thereafter removed, and the structure shown in FIG. 1(*c*) was obtained.

(4) The entire surface of the burying material layers 3*a*, 3*b* and 4 was isotropically etched by wet etching using a 10:1 BHF solution. At this time, etching was carried out to such an extent that the triangular burying material layer 4 on the active region having a small width was substantially planarized (to the maximum height of about 0.06 μm; see FIG. 2(*d*)). The burying material layers after etching were denoted by reference numerals 4*a*, 3*c* and 3*d*.

(5) Polishing was done by the CMP process. The condition of the CMP process at this time was as follows: number of revolution of main table=6.9 rpm, number of revolution of cross table=50 rpm, polishing pressure=350 gf/cm$^2$ and slurry flow rate=2.0 L/min. A mixed solution of silica, KOH and water was used as the slurry. In this process step, the burying material layers 4*a*, 3*c* and 3*d* were polished. In other words, as only the burying material layers 4*a*, 3*c* and 3*d* were polished, the polishing quantity could be reduced. In consequence, planarity for a inner surface of the wafer could be kept without depending on the pattern. As a result, the structure shown in FIG. 2(*e*) could be obtained.

Figure 2D:
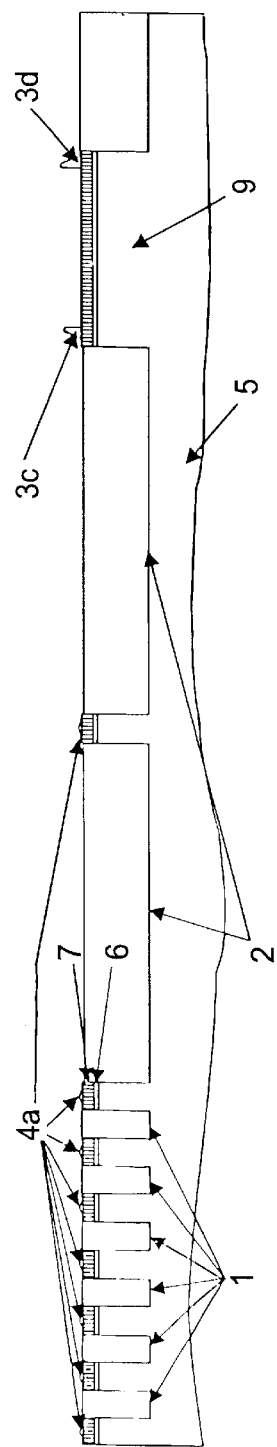
FIGS. 2(*d*) to 2(*f*) are schematic views illustrating the formation of trench isolation in accordance with Example 1 of the present invention.
Figure 2E:
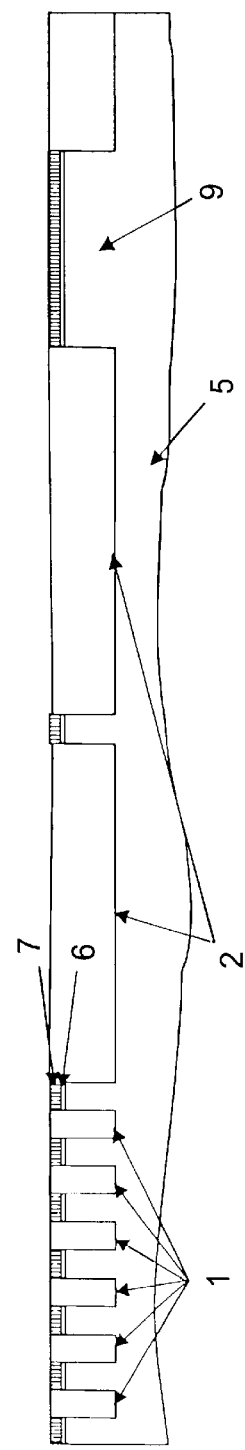
Figure 2F:
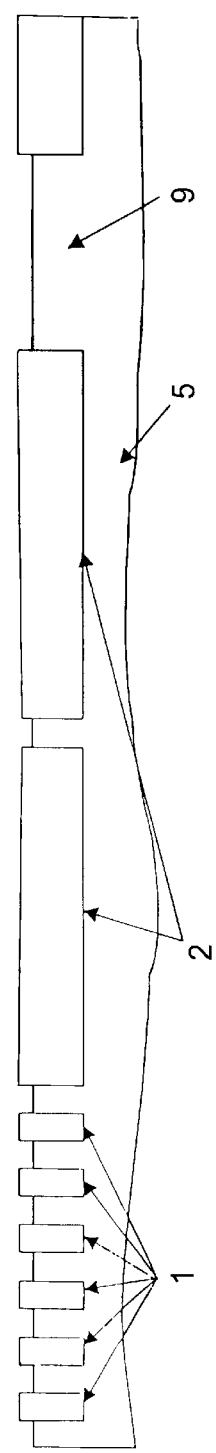

(6) Next, silicon nitride of the upper layer 7 and SiO$_2$ of the lower layer 6 were removed using phosphoric acid and HF, giving the structure shown in FIG. 2(*f*).

Example 2

This example represents the application of the present invention to the fabrication of a miniaturized and integrated semiconductor device, particularly to the formation of its trench isolation.

First, a lower layer 6 comprising a thermal oxidation film (T-SiO$_2$) and an upper layer 7 comprising a silicon nitride film were formed in advance on a substrate 5 made of silicon. Next, the substrate 5 was etched to form trenches 1 having a small width, trenches 2 having a large width, and convex regions having a small width and convex regions 9 having a large width.

The substrate having the trenches formed thereon was subjected to the following process steps (1) to (5) to form trench isolation.

(1) An SiO$_2$ film was deposited to a thickness somewhat greater than the trench depth by means of a high-density plasma enhanced chemical vapor growth (HDP) process as one of the deposition means for executing concurrently vapor phase growth and etching, giving burying material layers 13 (trapezoidal layer) and 14 (triangular layer, maximum height of 0.06 μm). In this way was obtained the structure shown in FIG. 3(*a*). The deposition condition at this time was as follows: LF=2,600 W, HF=2,000 W, SiH$_4$/O$_2$/He=475/154/50 sccm, pressure=2 mTorr and E/D ratio=0.20.

In this Example 2, the triangular shape on the active region having a small width was controlled by changing the E/D ratio so that the maximum height of the triangular layer became lower than the maximum height of Example 1. Therefore, Example 2 did not require the isotropic etching step that was necessary in Example 1. However, it was to be noted that the maximum height of the triangular layer and damage to the underlying layer had a trade-off relationship.

Next, since the wide convex region 9 existed in the substrate 5, the substrate 5 was subjected to the following process steps (2) and (3).

(2) A resist was patterned in such a fashion that portions other than the wide convex region 9 (on the trapezoidal layer) remained to formed a resist mask 8, as shown in FIG. 3(*b*).

(3) The burying material layer 3 was then etched. This etching was conducted using magnetron RIE under the condition of CH$_4$/CHF$_3$/Ar=50/30/400 sccm, RF power=1,300 W and pressure=250 mTorr.

At this time, etching was carried out up to active region having a small width, that is, the height (the height represented by dotted lines) of the planar portion on the trench 1. Thereafter, the resist mask 8 was removed, and the structure shown in FIG. 3(*c*) was obtained.

(4) Polishing was carried out by means of the CMP process. The condition of the CMP process at this time was as follows: number of revolution of main table=6.9 rpm, number of revolution of cross table=50 rpm, polishing pressure=350 gf/cm$^2$ and slurry flow rate=2.0 L/ min. A mixed solution of silica, KOH and water was used as the slurry. Since only the burying material layers 4*a*, 13*a* and 13*b* were polished in this process step, the polishing quantity could be reduced. As a result, planarity of an inner surface of the wafer could be kept without depending on the pattern. In this way was obtained the structure shown in FIG. 4(*d*).

Figure 4D:
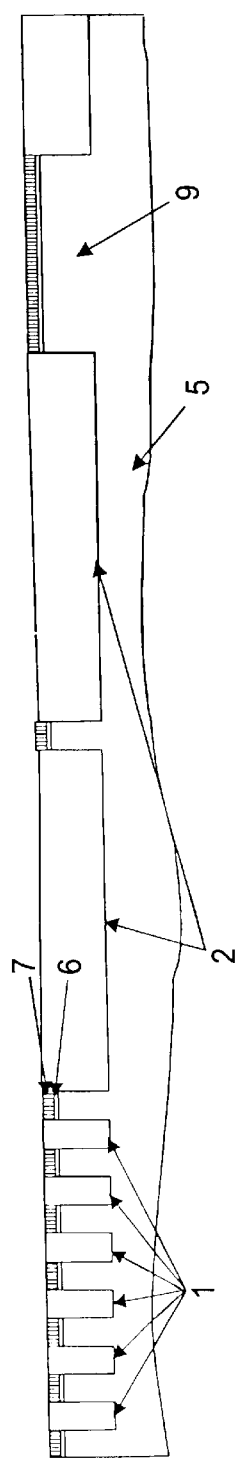
FIGS. 4(*d*) and 4(*e*) are schematic views illustrating the formation of trench isolation in accordance with Example 2 of the present invention.
Figure 4E:
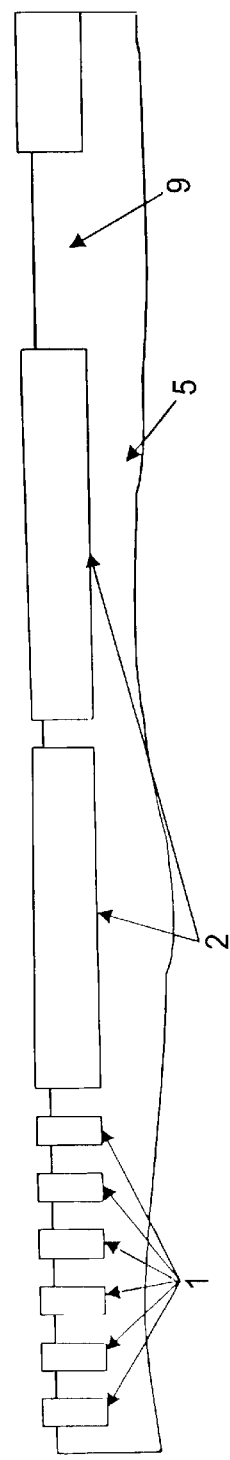

(5) Next, silicon nitride of the upper layer 7 and SiO$_2$ of the lower layer 6 were removed with phosphoric acid and HF, giving the structure shown in FIG. 4(*e*).

As described above, the present invention can accomplish planarization without leaving the burying material on the dense active regions having a small width and on the wide convex regions. Therefore, the present invention can form trench isolation having high planarity. The present invention can also provide a production method of a semiconductor device having such trench isolation.

In a production method of a semiconductor device which method involves a CMP process step for executing planarization after burying, the present invention can provide a production method of a semiconductor device which can form excellent planarized shapes even on those portions, which exhibit a polishing stopper function to a to-be-polished material and the distribution of which is not uniform, and those portions which have a low area ratio of a polishing stopper layer per unit area.

What is claimed is:

1. A method of forming trench isolation comprising:

burying a plurality of trenches formed in a substrate with a burying material and simultaneously forming a burying material layer on a protrusive region between adjacent trenches, by use of a process for concurrently executing vapor phase growth and etching;

forming a trapezoidal layer portion of the burying material on a wide region of the protrusive region and triangular layer portions of the burying material on respective narrow regions of the protrusive region;

etching a central portion of the trapezoidal layer portion to form a concave portion in the trapezoidal layer portion;

after said etching of the central portion of the trapezoidal layer portion, conducting an isotropic etching of an entire surface of the burying material in such a manner so as to remove a substantial portion of the burying material layer from the protrusive region and expose a central portion of a polishing stop layer on the wide region of the protrusive region, and so as to leave a portion of the burying material layer on the wide portion of the protrusive region; and removing the portion of the burying material layer remaining on the wide portion of the protrusive region by a CMP process for planarization.

2. A method of forming trench isolation comprising:

burying a plurality of trenches formed in a substrate with a burying material and simultaneously forming a burying material layer on protrusive regions between adjacent trenches thereby forming a burying material layer, and wherein the protrusive regions comprise a wide region and a plurality of narrow regions, forming, for the burying material layer, at least a trapezoidal layer portion of the burying material on the wide region and at least a triangular layer portion of the burying material on each of the narrow regions when the trenches are buried;

etching a central portion of the trapezoidal layer portion using a mask or resist to form a concave portion in the trapezoidal layer portion of the burying material layer;

after said etching a central portion of the trapezoidal layer portion, isotropically etching the entire surface of the burying material layer including portions over the trenches, the triangular layer portions, and remaining portions of the trapezoidal layer portion;

wherein said isotropically etching is performed after said concave portion is formed in the trapezoidal layer portion and results in a portion of an etch stop layer being exposed above the wide region, and a portion of the burying material remaining on the wide region; and removing burying material layer remaining on the wide region after said step of isotropically etching by a CMP process for planarization.

3. A method according to claim 2, wherein the portion of the burying material layer remaining on the protrusive region between adjacent trenches after said isotropic etching includes a triangular layer whose maximum height is not smaller than 0.06 $\mu$m.

4. A method according to claim 3, wherein the triangular layer is isotropically etched in such a manner that the maximum height thereof becomes not greater than 0.06 $\mu$m.

5. A method according to claim 2, wherein the process for concurrently executing vapor phase growth and etching is a high-density plasma enhanced chemical vapor deposition and the burying material comprises silicon dioxide.

6. A method according to claim 2, wherein the etching of the trapezoidal layer to form the concave portion is isotropical or anisotropical etching.

7. A method according to claim 2, wherein the protrusive region has, on an upper surface thereof, a layer of silicon nitride or a laminated layer of silicon dioxide and silicon nitride formed thereon which acts as a polishing stop layer in the CMP process, and the burying material is silicon dioxide.

8. A method according to claim 1 which is adapted for forming trench isolation in the semiconductor device.

* * * * *